Sept. 1, 1964 T. W. MENDEL 3,147,152

DIFFUSION CONTROL IN SEMICONDUCTIVE BODIES

Filed Jan. 28, 1960 2 Sheets-Sheet 1

INVENTOR
T. W. MENDEL
By S. Gundersen
ATTORNEY

Sept. 1, 1964 T. W. MENDEL 3,147,152

DIFFUSION CONTROL IN SEMICONDUCTIVE BODIES

Filed Jan. 28, 1960 2 Sheets-Sheet 2

INVENTOR
T. W. MENDEL
BY S. Gundersen
ATTORNEY

3,147,152
DIFFUSION CONTROL IN SEMICONDUCTIVE BODIES

Thomas W. Mendel, Reading, Pa., assignor to Western Electric Company, Incorporated, New York, N.Y., a corporation of New York Filed Jan. 28, 1960, Ser. No. 4,564
6 Claims. (Cl. 148—1.5)

Figure 1:
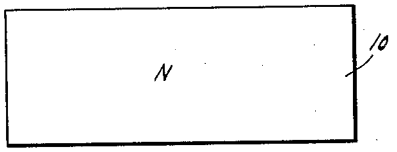

This invention relates to the control of diffusants in semiconductive material and particularly to the control of out-diffusion from semiconductive bodies which have have previously had carrier impurities diffused into layers adjacent the surface.

The fabrication of semiconductive devices, diodes as well as transistors, by the diffusion of impurities into semiconductive starting material frequently requires that the semiconductive body be subjected to elevated secondary temperatures subsequent to the original diffusion, for example, to alloy or additionally diffuse in order to alter carrier lifetime. When these secondary temperatures reach ranges at which the mobility of the previously diffused impurity is appreciably enhanced, several disadvantageous effects can occur. Among these is the out-diffusion through the semiconductive surface of the originally diffused impurity. This effect, when it is recognized and controlled, may be utilized to vary the surface impurity concentration of the originally diffused material. However, it becomes a problem when the original diffusion has provided the proper surface carrier concentration and the secondary temperature is not intended to vary the diffusant surface concentration or the concentration in depth.

In addition, undesired out-diffusion is troublesome because the impurity which is inadvertently out-diffused becomes a source of contamination which interferes with control of the process for which the secondary high temperatures is necessary. The purpose of the secondary temperature is most often to diffuse another impurity into the body at a different location than the original diffusion. Precise control of the second diffusion then becomes practically impossible since simultaneous out-diffusion of some of the originally diffused material modifiies the effective surface concentration of the second diffusant. In other situations, the concentration of the out-diffused impurity may produce a localized skin of the out-diffused impurity type.

An object of the invention is, therefore, to avoid in semiconductive body fabrication the self-contamination by the out-diffusion of impurities from previously diffused zones. A special related object is to prevent the formation of undesired layers by the out-diffusion of impurities from the semiconductive body and, further, to avoid deleterious effects of etching required for removing undesired layers produced by out-diffusion.

Still another object universally applicable to all junction semiconductive bodies is the prevention of short circuits occasioned by the existence across junctions of skin layers produced by material out-diffused from a portion of the semiconductive body.

It is another object of the invention to control the impurity concentration gradient in depth of diffused layers in semiconductive bodies of all types.

The present invention provides a solution to the above considered undesired effects and may be applied in several embodiments to different problems, as will be shown. Basically, the invention involves applying a layer over an already diffused zone. In subsequent steps involving the application of heat sufficient to increase the mobility of the diffusant, contaminating out-diffusion is inhibited by the impermeable layer. On the other hand, the final distribution of the impurity concentration is made more readily predictable and controllable since the entire amount of originally diffused material is available for further diffusion into the semiconductive body.

In one aspect of the invention the impermeable capping layer may be selected to be permeable to other diffusing impurities. Boron and gallium, for instance, can diffuse through a layer of silicon oxide which is impermeable to phosphorus. Thus, after the original diffusion and capping, a second impurity may be diffused through the capping layer into the same zone as the original diffusant to produce an effect which is the algebraic sum of the donor-acceptor and diffusion mobility characteristics of the two diffusants.

Figure 10:
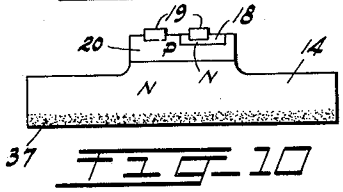
Figure 11:
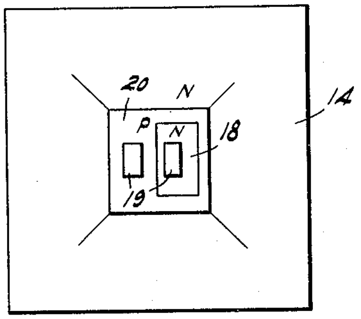
Figure 12:
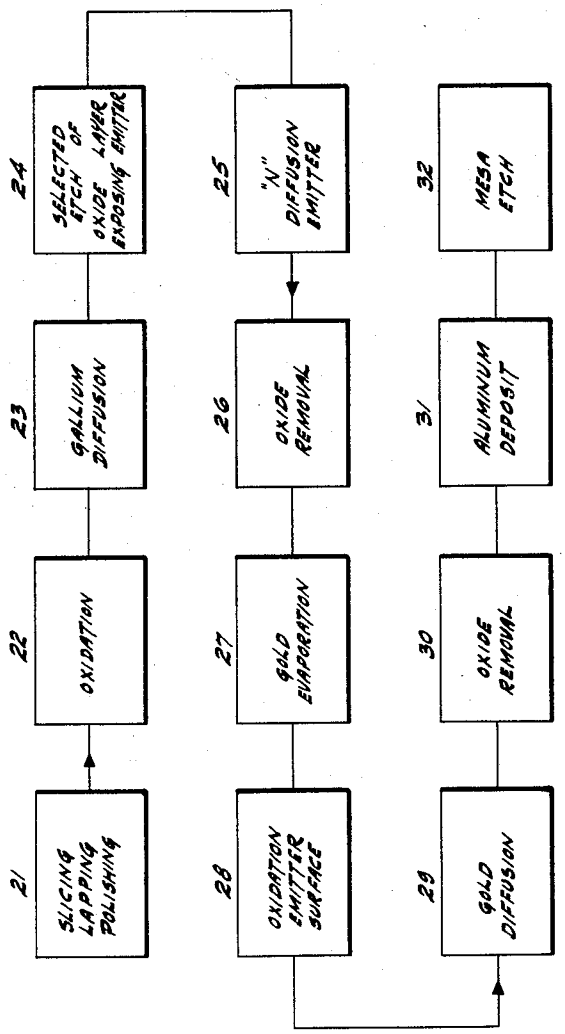

The invention will now be described in connection with one embodiment shown in the drawing in which:

FIGS. 1 through 11 represent a mesa-type diffused base NPN silicon transistor at different stages of fabrication, and FIG. 12 is a flow sheet indicating the sequential steps involved in producing the device of FIGS. 10 and 11.

The fabrication of a silicon NPN diffused base transistor having a mesa configuration of the type shown in FIGS. 10 and 11 represents an embodiment of the invention particularly well suited to demonstate the advantageous qualities of the process. Extension of the basic principles of the invention to other uses will become apparent to those versed in the art.

FIG. 1 represents a wafer of N-type silicon which is the starting material for the fabrication of a single transistor. The dimensions for a typical wafer are 0.030 inch by 0.030 inch by 0.003 inch. In the production of transistors of this type, it will be understood that transistors are seldom, if ever, individually produced. Rather, a plurality of transistors are fabricated from a single large sheet of semiconductive material which is exposed as one piece to successive diffusion and etching steps. Masking is used to separate similar portions of different transistors. Towards the end of the process, the single large sheet is cut into parts, each one representing an individual transistor. For purposes of illustration, however, the description will relate the process as applied only to a wafer which will become a single transistor unit.

The wafer of FIG. 1 is a portion of a single silicon crystal appropriately purified and having a desired and consistent resistivity. The first step of the process may be the slicing, lapping, and polishing of the purified material as represented in the flow sheet of FIG. 12 at 21. Following this preliminary step, the wafer is subjected to an oxidation step 22 as indicated in FIG. 12. Several chemical oxidizing agents, such as, nitric acid or hydrogen peroxide, will give the oxide layer. It has been found, however, that the use of a standard oxidizing furnace using an oxygen atmosphere in which the wafer is maintained at a temperature of 1,200 to 1,400° C. for approximately three hours provides the maximum control. Under such conditions an oxide layer is produced at the surface of the wafer having a thickness of 0.04 mil.

Figure 2:
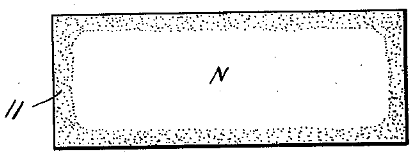
Figure 3:
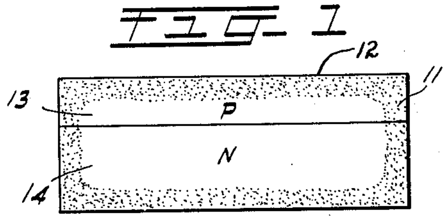
Figure 4:
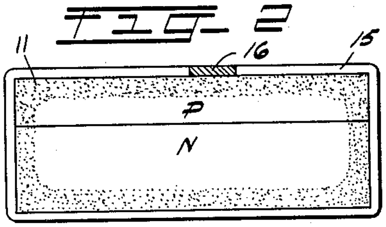
Figure 5:
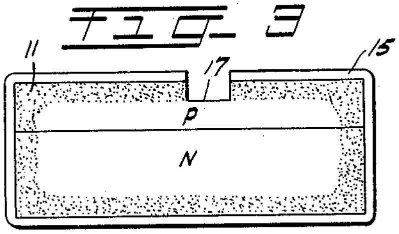

The result of the oxidation step 22 is shown in FIG. 2 where the oxide layer is shown at 11. It will be understood that FIGS. 1 through 11 are not to scale since it would be impractical to represent the details of the process with scale drawings. Layer 11 is a silicon oxide layer and is used as a mask to properly locate a later diffused zone. In order to appropriately serve this purpose, it is necessary that layer 11 be impermeable to the doping impurity. However, it is unnecessary that layer 11 be universally impermeable to doping impurities. As a matter of fact, silicon oxide is permeable to the acceptor impurity gallium and the donor impurity boron, while it is impermeable to the donor impurity phosphorus and the acceptor impurity aluminum. This characteristic permits the step of diffusing gallium, FIG. 12, step 23) through the top surface 12 (FIG. 3) of the wafer to form the P-type zone 13 and the P-N junction between layer 13 and N-type layer 14.

Figure 6:
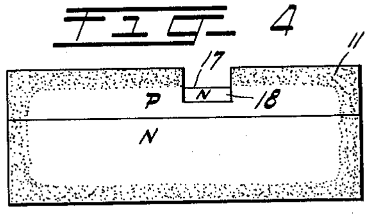

The next step, as shown in FIG. 12, 24, is selected etching away of the oxide layer to expose the P-type surface at which the emitter will be formed. The selective etching may be satisfactorily accomplished by covering the surface of wafer 10 with a photo-resist emulsion 15, FIG. 4, masking the prospective emitter area which is a rectangle on surface 12 approximately 4 by 6 mils in dimension, exposing the emulsion to ultra-violet light and baking and heating the emulsion to make it stick to the surface. The unexposed emulsion 16 is then removed, exposing the semiconductive surface area. That portion of the oxide layer 16 over the prospective emitter area is then removed by an appropriate etching step, leaving surface 17, FIG. 5, of the P-type zone exposed. Photo-resist emulsion 15 may then also be removed. The next step, FIG. 12, 25 is the diffusion of phosphorus, an N-type impurity, into the P-type zone immediately beneath emitter surface 17. The oxide layer 11 functions to prevent the diffusion of phosphorus into other portions of the body 10. Formation of the emitter zone 18, FIG. 6, is followed by complete removal of the remaining oxide, FIG. 12, 26, leaving the structure of FIG. 7 which is the basic form of the NPN silicon transistor.

Figure 7:
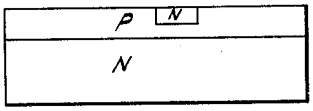
Figure 8:
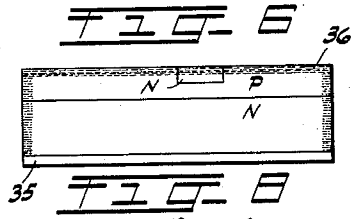
Figure 9:
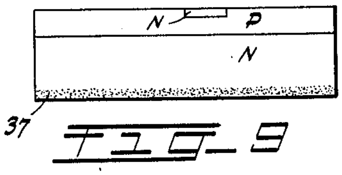

Although the device shown in FIG. 7 may be used for some transistor purposes, several considerations dictate additional measures which must be taken to provide transistors adapted to special purposes. It may be desirable, for example, to reduce the carrier concentration at the emitter surface. Normally the diffused carrier concentration is highest at the diffusion surface and decreases as a complementary error function into the body normal to the diffusion surface. However, if the diffused zone surface area is used to form a junction, perhaps by alloying another impurity at the surface, the high carrier surface concentration results in a low junction breakdown voltage. One method of decreasing the surface carrier concentration and therefore increasing the reverse breakdown voltage while at the same time fully utilizing the diffusant already in the diffused zone is to cap the diffused zone with another oxide layer to prevent out-diffusion and then further expose the body to a diffusing temperature. This redistributes the carrier concentration in the diffused zone and reduces the surface concentration of the diffusant.

However, in the illustration shown, the invention is applied to a different purpose. It is desired to reduce the minority carrier lifetime in the collector region of this transistor, and the invention will be further discussed in this connection.

A known method of reducing the minority carrier lifetime in silicon is to diffuse gold into the junction region of the body. While gold will start to diffuse into silicon at temperatures as low as 400° C., it has become necessary in the more advanced transistor models used in switching circuitry to more drastically reduce the minority carrier lifetime. The method of achieving this is to diffuse at temperatures as high as 1,000° C. A problem arising in connection with the presently considered transistor type involves the fact that aluminum contact strips 19 are used to make low resistance connections with the emitter 18 and the base 20 zones as shown in FIG. 10. To overcome the P-type characteristic of the aluminum and reduce the attendant high saturation voltages, it becomes necessary to increase the phosphorus concentration in the emitter zone 18 to the relatively high value of approximately $10^{21}$ impurity atoms per centimeter in order to increase the emitter efficiency. However, this technique produces other difficulties, for at the high temperatures proposed for the gold diffusion, sufficient phosphorus is out-diffused from the emitter zone to contaminate the environment and to precipitate an N type of skin over the surface of the wafer. This skin formed by the out-diffused phosphorus is the source of several undesirable phenomena among which are excessive large base currents and low emitter breakdown voltages. Etching, commonly relied upon to remove undesired surface states, provides a partial solution to this problem and, indeed, compounds the difficulties. Etching removes portions of the emitter resulting in a weakened bond between the emitter and aluminum contact 19 and in addition reduces the volume of base section 20 causing an increase in sheet resistivity of the base.

It was found that the techniques of the present invention as described below are particularly suitable to eliminating these difficulties. As shown in FIG. 12, 27, gold is evaporated and deposited on the collector surface without appreciably being diffused into the transistor, FIG. 8, 35. This condensation may be practiced at temperatures below approximately 600° C. which is lower than the temperature at which out-diffusion from the phosphorus is detrimental (approximately 800° C.). The wafer is then placed in an oxidation furnace and heated to approximately 750° C. until a silicon oxide layer about 0.013 mil thick is produced over the entire exposed surface area of the wafer, FIG. 12, 28. The gold 35 condensed on the collector surface is then diffused into the collector zone in a diffusion furnace at a temperature of approximately 1,000° C., FIG. 12, 29. The very thin oxide layer 36 is then easily removed by etching, FIG. 12, 30, without the harmful effects of extreme etching previously discussed. The resulting structure is that shown in FIG. 9 in which the diffused gold is shown at 37.

After the gold diffusion and oxide removal, FIG. 12, 31, the aluminum contacts are accurately located on the emitter area and on the base region. The wafer is then placed in an alloying furnace, and there subjected to heat of 750° to alloy the aluminum to the silicon. The emitter area 18 and portion of the base 20 including the aluminum stripes 19 are covered with an etch resistant coating. The uncoated portions are then etched away, leaving the raised mesa area including the emitter and the base. The resulting structure is shown on the front view in FIG. 10 and top view in FIG. 11.

Although the invention has been described in one embodiment, it will be understood that other manifestations of the principle may appear in other embodiments. The use of the diffusant impermeable cap to control the concentration gradient of diffusants has already been mentioned. Such a redistribution or controlled spreading of the diffusant may be practiced in a simple case with only a single diffusant. However, it should be appreciated that more complex utilization of the invention is practical. For example, the capping layer can be impermeable to the first diffusant and permeable to a subsequent diffusant, thus making possible the diffusion of the subsequent diffusant through the layer without the necessity for intermediate removal of such layer. The concentration gradient as well as the dominating carrier type and location of the P-N junction will then be dependent upon the particular concentrations, diffusing temperatures, and diffusing times of the process as well as the diffusion constants of the materials involved. These characteristics, varying with depth, will be dependent upon the algebraic sum of the diffused impurities with the donors being allocated one sign and the acceptors another. Numerous other embodiments within the scope and spirit of the present invention will undoubtedly occur to those versed in the art. It is to be understood that the invention is not intended to be limited to the use of the particular semiconductive materials or significant materials mentioned in the illustrative embodiment.

What is claimed is:

1. A method of fabricating semiconductor devices exhibiting fast switching rates and relatively high breakdown voltages comprising the steps of forming on at least a portion of a semiconductor body a first oxide layer permeable to diffusion therethrough of a first impurity material and impermeable to diffusion therethrough of a second different impurity material, diffusing the first impurity material through said first layer into the body at a first predetermined temperature to form a first diffused zone exhibiting a desired and permanent degree of surface impurity concentration, removing at least one discrete portion of the first layer from the surface of said body, diffusing a second impurity material at a second predetermined temperature into said body where the first layer has been removed, thereby forming a second diffused zone exhibiting a desired and permanent degree of surface impurity concentration, removing the entire first oxide layer, evaporating and depositing a noble metal on at least a part of a previously undiffused surface area of said body at a third temperature which neither appreciably alters the surface impurity concentration or causes out-diffusion of at least said second impurity material, applying a second impermeable oxide layer over at least zone with a second diffused impurity to prevent both out-diffusion of said second diffused impurity and appreciable alteration of the surface impurity concentration thereof when said body is heated to a fourth predetermined temperature to diffuse said noble metal into the previously undiffused surface area of said body to a depth and surface concentration necessary to obtain a high switching rate for said device.

2. A method in accordance with claim 1 wherein said semiconductor body is an N-type material, said first and second layers are an oxide of said N-type material, said first impurity material is of the P-type, said second impurity material is of the N-type, and said third material is a noble metal.

3. A method in accordance with claim 1 wherein said semiconductor body is N-type silicon, said first and second layers are silicon oxide, said first impurity material is germanium, said second impurity material is phosphorus, and said third material is gold, and wherein said diffused phosphorus forms the emitter areas of each fabricated device and has a concentration of approximately $10^{21}$ impurity atoms per cubic centimeter to increase the emitter efficiency, and wherein said third temperature for diffusing said gold into said body is approximately 950° C.

4. A method of fabricating semiconductor devices exhibiting fast switching rates and relatively high breakdown voltages comprising the steps of forming on at least a portion of a semiconductor body a first oxide layer permeable to diffusion therethrough of a first impurity material and impermeable to diffusion therethrough of a second different impurity material, diffusing the first impurity material through said first layer into the body at a first predetermined temperature to form a first diffused zone exhibiting a desired and permanent degree of surface impurity concentration, removing at least one discrete portion of the first layer from the surface of said body, diffusing a second impurity material at a second predetermined temperature into said body where the first layer has been removed, thereby forming a second diffused zone exhibiting a desired and permanent degree of surface impurity concentration, removing at least a portion of said first layer, at least part of which is from a previously undiffused surface area of said body, evaporating and depositing a noble metal on at least a part of the exposed and previously undiffused surface area of said body at a third temperature which neither appreciably alters the surface impurity concentration or causes out-diffusion of at least said second impurity material, applying a second impermeable oxide layer over at least said zone with a second diffused impurity to prevent both out-diffusion of said second diffused impurity and appreciable alteration of the surface impurity concentration thereof when said body is heated to a fourth predetermined temperature to diffuse said noble metal into the previously undiffused surface area of said body to a depth and surface concentration necessary to obtain a high switching rate for said device.

5. In the method of processing silicon semiconductive material by the diffusion of impurities, the steps in which a first oxide layer is formed on a body of N-type silicon, a P-type significant impurity capable of diffusing through the oxide layer is diffused into the body to produce a P-type zone, at least one discrete portion of the oxide layer is removed to expose a part of the P-type zone, an N-type significant impurity incapable of diffusing through the oxide layer is diffused into the exposed P-type zone to form an emitter zone, at least a portion of the remaining first oxide layer adjacent a previously undiffused surface area is removed, the improvement which comprises forming a layer of gold on at least a part of the exposed and previously undiffused surface area of the body, and then capping at least the diffused emitter zone with a second oxide layer impervious to the N-type significant impurity, said second oxide layer preventing out-diffusion of the N-type significant impurity during the subsequent heating required to diffuse said gold into the previously undiffused portion of the body.

6. In the method of processing silicon semiconductive material by the diffusion of impurities, the steps in which a first oxide layer is formed on a body of N-type silicon, a P-type significant impurity capable of diffusing through the oxide layer is diffused into the body to produce a P-type zone, at least one discrete portion of the oxide layer is removed to expose a part of the P-type zone, a phosphorus N-type significant impurity incapable of diffusing through the first oxide layer is diffused into the exposed P-type zone to form an emitter zone, at least a portion of the remaining oxide layer adjacent a previously undiffused surface area is removed, the improvement which comprises forming a layer of gold by condensing the gold on at least a part of the exposed and previously undiffused surface area of the body, and capping the previously diffused emitter zone with a second oxide layer impervious to the phosphorus N-type significant impurity, said capping including the heating of the oxide in an oxidizing furnace at a temperature up to 780° C. until the oxide layer is about 0.013 mil thick over the entire surface area of the body, said second oxide layer preventing out-diffusion of the phosphorus N-type significant impurity during the subsequent heating at a temperature of about 1000° C. and for a period of time necessary to diffuse a predetermined amount of the gold into the previously undiffused portion of the body.

References Cited in the file of this patent

UNITED STATES PATENTS

| | | |
|---|---|---|
| 2,796,562 | Ellis et al. | June 18, 1957 |
| 2,802,760 | Derick et al. | Aug. 13, 1957 |
| 2,823,149 | Robinson | Feb. 11, 1958 |
| 2,937,114 | Shockley | May 17, 1960 |

OTHER REFERENCES

Journal of the Electrochemical Society (Aschner et al., May 1959, relied on pages 415–417.